US005748130A

United States Patent [19]

Wicnienski

[11] Patent Number: 5,748,130

[45] Date of Patent: May 5, 1998

[54] ANALOG TO DIGITAL CONVERTER HAVING MULTI-STATE OUTPUT

[76] Inventor: Michael F. Wicnienski, 36903 Carol La., Lake Villa, Ill. 60046

[21] Appl. No.: 632,652

[22] Filed: Apr. 15, 1996

[51] Int. Cl.[6] .................................................. H03M 1/36

[52] U.S. Cl. .................................................. 341/155

[58] Field of Search .................................................. 341/155

[56] References Cited

U.S. PATENT DOCUMENTS 3,840,891 10/1974 Hellwarth .
4,633,161 12/1986 Callahan et al. .
5,039,872 8/1991 Oldham .
5,168,271 12/1992 Hoff .
5,194,867 3/1993 Fisher .................................................. 341/159
5,255,428 10/1993 Gottsche et al. .

*Primary Examiner*—Jeffrey A. Gaffin
*Assistant Examiner*—Jason H. Vick
*Attorney, Agent, or Firm*—James Ray & Associates

[57] ABSTRACT

An analog to digital converter provides a device for characterizing, in digital terms, a first quantity having a magnitude which varies as a function of a second quantity. An output signal is generated having more than two values, the output signal indicating the magnitude of the first quantity in comparison to a reference level and the change in the magnitude of the first quantity as a function of the second quantity.

20 Claims, 8 Drawing Sheets

ANALOG TO DIGITAL CONVERTER HAVING MULTI-STATE OUTPUT

FIELD OF THE INVENTION

The present invention relates, in general, to logical engines, and, more particularly, the instant invention relates to analog to digital converters.

BACKGROUND OF THE INVENTION

Knowledge of the art of digital computers will provide a very broad background for an understanding of the present invention. In a digital computer, for example, the information is processed as signals representing discrete numbers. This is in contrast to analog computers, in which the information is processed as signals representing information which is continuous rather than discrete. Digital computers have the advantage that information does not lose accuracy as it is processed, as is generally the case for analog computers.

Most of the available background art for digital computers is for digital binary computers. These computers store and convey the information as binary variables such as the digits 1 and 0. In a modern electronic computing system, these may be represented by an electronic switch, which may be either closed or open, or a voltage on a conductor which may have one of two distinct values, for example, 5 Volts or 0 Volts.

If, in a prior art digital binary system, a signal which varies arbitrarily in time is to be analyzed, such signal may be represented as a binary variable which has a sequence of binary values. For example, at any instant, the variable could have a binary value representing a signal level above a predetermined reference level, or it could have a binary value indicating a signal level below the predetermined reference level.

In some cases it is desirable to analyze a signal, obtaining at any instant an indication that the signal is:

(1) above a predetermined reference level and rising, (2) above the predetermined reference level and falling, (3) below the predetermined reference level and falling, and (4) below the predetermined reference level and rising.

In a digital binary system, this may be accomplished using a second binary variable which likewise has a sequence of binary values.

As before, the first binary variable would indicate whether the signal level was above or below the predetermined reference level, and the other binary variable would indicate whether the signal level was either rising or falling. The two binary values, which could be, for example, discrete binary voltages on a pair of conductors, would then be used subsequently in additional logical circuits. This approach has the disadvantage that a pair of binary circuits is needed to represent the analyzed signal. In addition, digital binary systems do not lend themselves in any particularly logical way to analyses of signals which result in a four-valued indication, such as the four values cited above.

SUMMARY OF THE INVENTION

An analog to digital converter is provided for interpreting a first numerical value of a first physical quantity such as a voltage signal, a current signal, or an optical signal. A person skilled in the art will recognize that the numerical value of a physical quantity is determined in reference to a predetermined unit of measurement. For example, a numerical value for a voltage signal is the number of volts or millivolts measured on a conductor which carries the signal. The numerical value of a current signal is the number of amperes or milliamperes flowing through a conductor carrying the signal. The first numerical value of the first physical quantity depends upon a second numerical value of a second physical quantity. Time, for example, could be the second physical quantity. A person skilled in the art will recognize that a numerical value for time is the time measured in a predetermined unit such as the second. The device produces an output, for each second numerical value of the second physical quantity, the output providing an indication of a third physical quantity. The third physical quantity is indicative of the first physical quantity in relation to the second physical quantity. The device has means for making a first determination as to whether the first numerical value of the first physical quantity is in excess of a predetermined reference value, and means for making a second determination as to whether the first numerical value of the first physical quantity is increasing or decreasing with the second numerical value of the second physical quantity. The device generates its output based on the first determination and on the second determination, the output having one of at least four alternative output values. It has the first output value if the first value of the first physical quantity is in excess of the predetermined reference value and the first value of the first physical quantity is increasing with the second numerical value of the second physical quantity. It has the second output value if the first value of the first physical quantity is in excess of the predetermined reference value and the first value of the first physical quantity is decreasing with the second numerical value of the second physical quantity. It has the third output value if the first value of the first physical quantity is less than the predetermined reference value and the first value of the first physical quantity is decreasing with the second numerical value of the second physical quantity, and it has the fourth output value if the first value of the first physical quantity is less than the predetermined value and the first value of the first physical quantity is increasing with the second numerical value of the second physical quantity. The device further includes means for communicating the output value as a digital output from the logical engine.

In an additional aspect, an analog to digital converter is provided for interpreting a first numerical value of a first physical quantity. Such first numerical value of the first physical quantity depending upon a second numerical value of a second physical quantity. The device produces an output for each of the second numerical value of the second physical quantity. The output indicates a third physical quantity which indicates the value of the first physical quantity in relation to the second physical quantity. The device includes means for making a first determination as to whether the first numerical value of the first physical quantity is in excess of a predetermined reference value, and it also has a means for making a second determination as to whether the first numerical value of the first physical quantity is increasing or decreasing with the second numerical value of the second physical quantity. The device generates its output based on the first determination and on the second determination. The output has one of at least three alternative output values. It has a first output value if the first value of the first physical quantity is in excess of the predetermined reference value and the first value of the first physical quantity is increasing with the second numerical value of the second physical quantity. It has the second output value if the first value of the first physical quantity is in excess of the predetermined value and the first value of the first physical quantity is decreasing with the second numerical value of the second physical quantity, or if the first value of the first physical quantity is less than the predetermined value and the first value of the first physical quantity is increasing with the second numerical value of the second physical quantity. It has the third output value if the first value of the first physical quantity is less than the predetermined value and the first value of the first physical quantity is decreasing with the second numerical value of the second physical quantity. The device further includes means for communicating the output value as a digital output from the analog to digital converter.

In a further aspect, a logical engine is provided which has an oscillator for generating a first signal which varies periodically in time. Such logical engine includes a means for generating a reference value for the first signal and a means for generating a second signal which varies periodically in time. Such second signal having at least one of four values. It has a first value if the magnitude of the first signal is in excess of the reference value and the magnitude of the first signal is increasing with time. It has the second value if the magnitude of the first signal is in excess of the predetermined value and the magnitude of the first signal is decreasing with time. It has a third value if the magnitude of the first signal is less than the predetermined reference value and the magnitude of the first signal is decreasing with time and it has a fourth value if the magnitude of the first signal is less than the predetermined value and the magnitude of the first signal is increasing with time. The logical engine also includes a means for providing the second signal as a digital output. This logical engine further includes a means for generating a third signal varying periodically in time, wherein the third signal has at least one of three values. It has a first value if the magnitude of the first signal is in excess of the reference value and the magnitude of the first signal is increasing with time. It has the second value if the magnitude of the first signal is in excess of the predetermined value and the magnitude of the first signal is decreasing with time, or if the magnitude of the first signal is less than the predetermined value and the magnitude of the first signal is increasing with time. It has the third value if the magnitude of the first signal is less than the predetermined value and the magnitude of the first signal is decreasing with time. Finally, the logical engine includes a means for providing the third signal as a digital output.

OBJECTS OF THE INVENTION

It is, therefore, one of the primary objects of the present invention to provide an apparatus for representing information in a form which is digital in character, but which is not limited to digital binary systems.

It is an additional object of the present invention to provide an apparatus for analysis of signals in which a single digital signal indicates both whether the level of the signal is above or below a predetermined reference level and whether it is increasing or decreasing in time.

It is a further object of the present invention to provide an apparatus for processing information in a manner which permits overcoming of certain known limitations of prior art type digital binary systems.

It is yet another object of the present invention to provide an analog to digital converter for analysis of a signal which changes in time, the converter providing, on a single circuit, an indication of which of four states the signal currently is in, these states being:

(1) above a predetermined reference level and rising, (2) above the predetermined reference level and falling, (3) below the predetermined reference level and falling, and (4) below the predetermined reference level and rising.

It is still another object of the present invention to provide an analog to digital converter as a logical engine for analysis of a signal which changes in time, the engine providing, on a single circuit, an indication of which of three states the signal currently is in, these states being:

(1) above a predetermined reference level and rising;

(2) above the predetermined reference level and falling, or below the predetermined reference level and rising; and (3) below the predetermined reference level and falling.

It is yet still another object of the present invention to provide an oscillator which provides a periodic four-valued digital signal.

It is still yet another object of the present invention to provide an oscillator which provides a periodic three-valued digital signal.

In addition to the various objects and advantages of the present invention which have been generally described above, there will be various other objects and advantages of the invention that will become more readily apparent to those persons who are skilled in the relevant art from the following more detailed description of the invention, particularly, when the detailed description is taken in conjunction with the attached drawing figures and with the appended claims.

DETAILED DESCRIPTION OF THE PRESENTLY PREFERRED EMBODIMENT AND VARIOUS ALTERNATIVE EMBODIMENTS

Figure 1A:
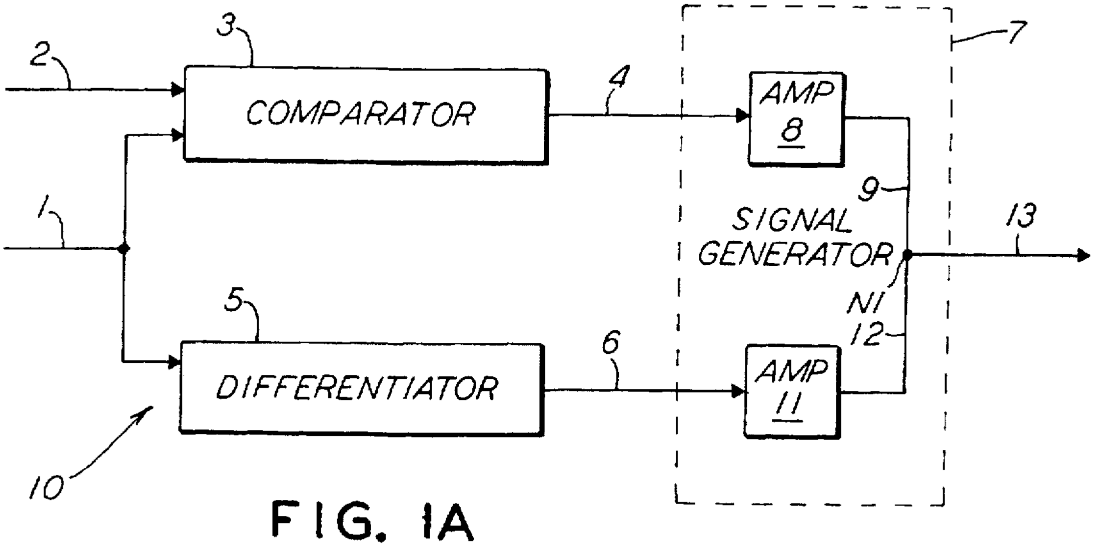
FIG. 1A is a schematic view of a four state analog to digital converter for analysis of signals which vary with time.
Figure 1B:
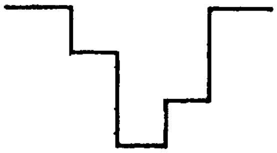
FIG. 1B illustrates a four state output signal obtained from the engine of FIG. 1A.

FIG. 1A illustrates an analytical engine, according to the present invention, which has a four level output. An incoming signal 1, which is the signal to be analyzed, is compared with a reference level signal 2 in a comparator 3. The output of the comparator 3 is a binary signal indicating whether such incoming signal 1 is in excess of or is less than such reference level signal 2.

Incoming signal 1 also enters a differentiator 5, which generates a signal 6 indicating the time derivative of the incoming signal 1. Signal 6 is a binary signal which indicates whether incoming signal 1 is increasing with time, or decreasing with time. Signals 4 and 6 may be voltage signals. Signal 4 and signal 6 enter an output signal generator 7, where they are combined to produce output signal 13.

The signal 4 enters an amplifier 8 where it generates an output signal 9. Signal 9 may be a current signal, having, for example, binary values of 2 milliamperes and 0 milliamperes.

The signal 6 enters an amplifier 11 where it generates an output signal 12. Signal 12 may be a current signal, having, for example, binary values of 1 milliampere and 0 milliamperes. These current signals 9 and 12 are combined at a circuit node N1 which provides the output current signal 13. For this particular example, the output current signal 13 has the following values based on the incoming signal 1 in comparison to signal level 2:

If the incoming signal 1 is greater than the signal level 2 and is increasing with time, then the output current equals 3 milliamperes.

If the incoming signal 1 is greater than the signal level 2 and is decreasing with time, then the output current equals 2 milliamperes.

If the incoming signal 1 is less than the signal level 2 and is decreasing with time, then the output current equals 0 milliamperes.

If the incoming signal 1 is less than the signal level 2 and is increasing with time, then the output current equals 1 milliampere.

A person skilled in the art will recognize that the function of this circuit can be accomplished by various equivalent circuits. For example, such signals 4 and 6 may be current signals which are combined to provide the signal 13 as a current signal. Likewise, the amplifiers 8 and 11 may provide voltage output. One method of combining these is for these to have opposite signs. In this case, a differential amplifier (not shown) may then be used to combine these to provide such signal 13, which may be either a voltage signal, or a current signal.

Figure 1C:
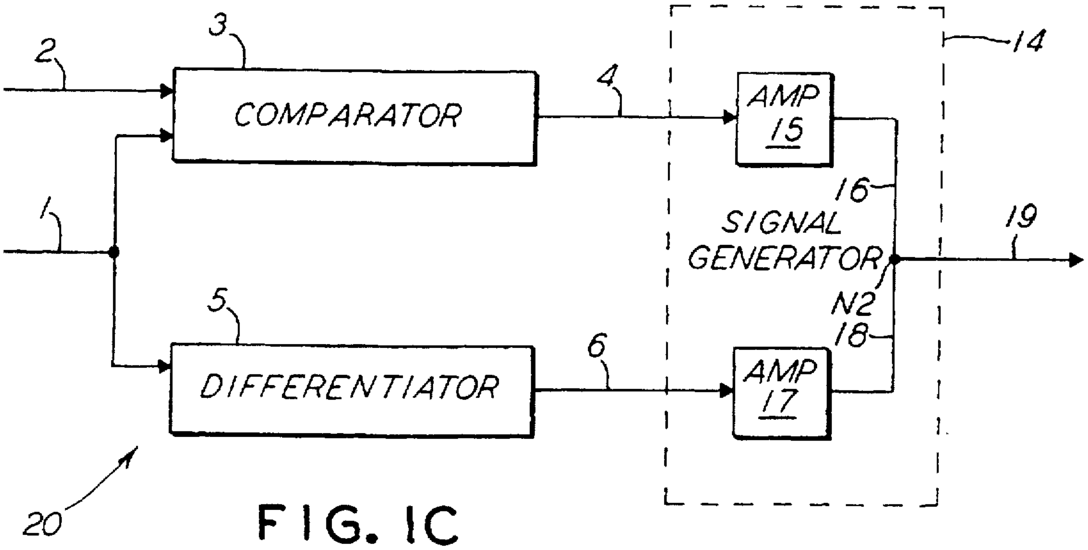
FIG. 1C is a schematic view of a three state analog to digital converter for analysis of signals which vary with time.
Figure 1D:
FIG. 1D illustrates a three state output signal obtained from the engine of FIG. 1C.

FIG. 1C illustrates an analytical engine, according to the present invention, which has a three level output. As before, an incoming signal 1, which is the signal to be analyzed, is compared with a reference level signal 2 in a comparator 3. The output of the comparator 3 is a binary signal indicating whether such incoming signal 1 is in excess of or is less than such reference level signal 2.

Incoming signal 1 also enters a differentiator 5, which generates a signal 6 indicating the time derivative of such incoming signal 1. Signal 6 is a binary signal which indicates whether incoming signal 1 is either increasing with time, or is decreasing with time. Such signals 4 and 6 may be voltage signals. Signal 4 and signal 6 enter an output signal generator 14, where they are combined to produce an output signal 19.

The signal 4 enters an amplifier 15 where it generates an output signal 16. Output signal 16 may be a current signal, having, for example, binary values of 1 milliampere and 0 milliamperes.

The signal 6 enters an amplifier 17 where it generates an output signal 18. Such output signal 18 may be a current signal, having, for example, binary values of 1 milliampere and 0 milliamperes. These current signals 16 and 18 are combined at a circuit node N1 which provides the output current signal 19. For this particular example, the output current signal 19 has the following three values based on incoming signal 1 in comparison to signal level 2:

Incoming signal 1 is greater than the signal level 2 and is increasing with time: 2 milliamperes.

Incoming signal 1 is greater than the signal level 2 and is decreasing with time: 1 milliampere.

Incoming signal 1 is less than the signal level 2 and is increasing with time: 1 milliampere.

Incoming signal 1 is less than the signal level 2 and is decreasing with time: 0 milliamperes.

A person skilled in the art will recognize that the function of this circuit can also be accomplished by various equivalent circuits. For example, such signals 4 and 6 may be current signals which are combined to provide output signal 19 as a current signal. Likewise, such amplifiers 15 and 17 may provide voltage output. A differential amplifier (not shown) may be used to combine these to provide the combined output signal 19, which may be either a voltage signal, or a current signal.

Figures 2A, 2B:
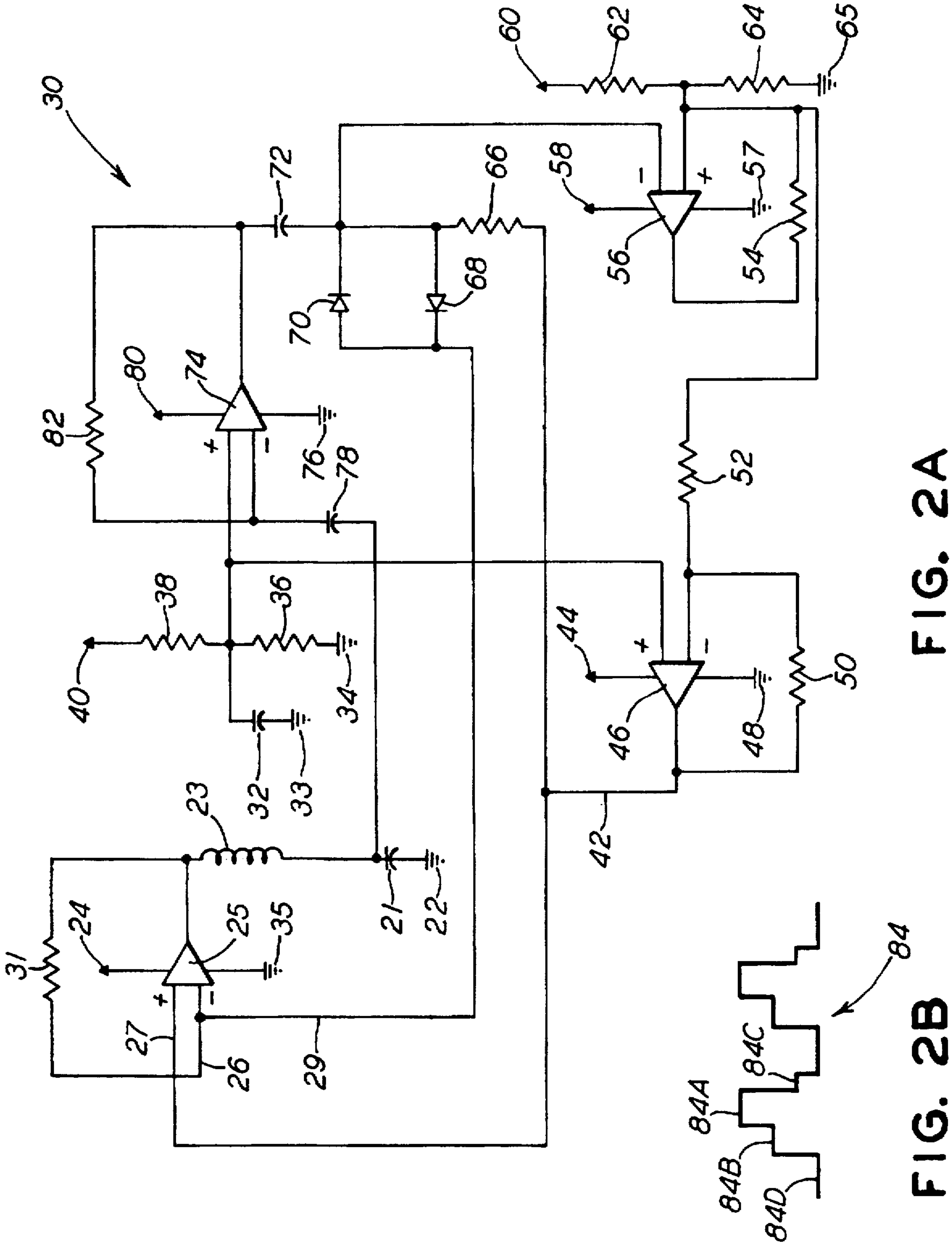
FIG. 2A is a schematic view of a simple four state oscillator.
FIG. 2B is a graphical representation of the output of the simple four state oscillator.

FIG. 2A is a schematic illustration of a simple four state logic engine 30 which exhibits a periodic four state output. In this embodiment, the first operational amplifier 25 is powered by a first supply voltage 24 and grounded through a first circuit ground 35. The output of the first operational amplifier 25 provides amplifier 25 with a first feedback signal 26 through resistor 31.

The output of such first operational amplifier 25 is connected to a circuit ground 22 through an inductor 23 and a capacitor 21. Inductor 23 and capacitor 21 act as a series resonant circuit which define the frequency of oscillation of such first operational amplifier 25, through such first feedback signal 26. Inductor 23 and capacitor 21 are connected through a capacitor 78 to the negative input terminal of an operational amplifier 74. There is a capacitor 78 that serves as a coupling capacitor which introduces a negligible phase shift. The operational amplifier 74 acts as an amplifier limiter. The output of this operational amplifier 74 is connected to its negative input terminal through a resistor 82.

Power is supplied to such operational amplifier 74 from a supply voltage 80, and it is grounded through a circuit ground 76. An input bias voltage for operational amplifier 74 is provided by a supply voltage 40, voltage divider resistors 38 and 36, and circuit ground 34. The junction of voltage divider resistors 38 and 36 is connected to a circuit ground 33 through a second capacitor 32. The output of operational amplifier 74 passes through capacitor 72 to the negative input of the operational amplifier 56, which is configured as a Schmidt trigger.

The output terminal of such operational amplifier 56 provides a feedback signal to its positive input terminal through another resistor 54. The operational amplifier 56 is powered by the supply voltage 58 and is grounded through ground 57. Bias voltage for operational amplifier 56 is provided by supply voltage 60, voltage divider resistors 62 and 64, and ground 65. The positive input terminal of operational amplifier 56 is connected to the negative input terminal of such operational amplifier 46 through the resistor 52.

Operational amplifier 46 is powered by the supply voltage 44 and is grounded through ground 48. Its output is connected to its negative input terminal through another resistor 50. Its output signal 42 is also connected to the positive input terminal of operational amplifier 25. Capacitor 72 cooperates with resistor 66 to act as a differentiator. Resistor 66 passes the second feedback signal 27 to the positive input terminal of such operational amplifier 25.

The junction of capacitor 72 and resistor 66 is connected through antiparallel diodes 68 and 70 to the negative input terminal of operational amplifier 25. This pair of antiparallel diodes 68 and 70 blocks voltages in either direction which are below a predetermined threshold value, but passes voltages in either direction which exceed the predetermined threshold value.

FIG. 2B is a graphical representation of the output 84 of the simple four state oscillator. This output has the following four levels:

For V positive and DV positive, level 84A;

For V positive and DV negative, level 84B

For V negative and DV negative, level 84D;

For V negative and DV positive, level 84C.

Figure 2D:
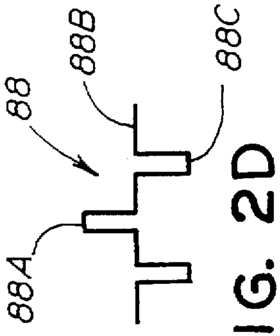
FIG. 2D is a graphical representation of a the output of the typical three state oscillator.
Figure 2C:
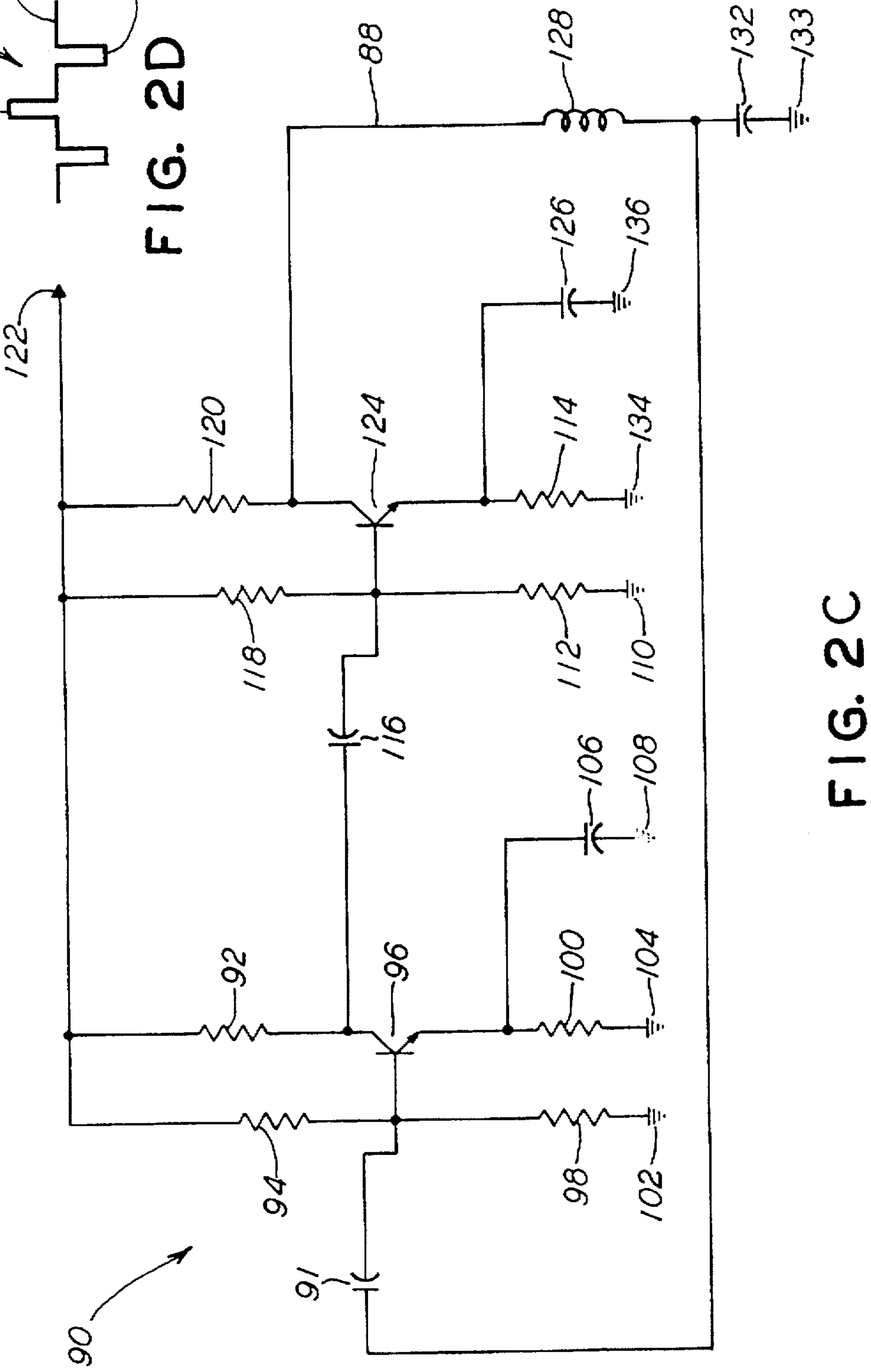
FIG. 2C is a schematic view of a typical three state oscillator.

FIG. 2C is a schematic illustration of a typical three state logical engine 90, which exhibits a three state output. This circuit has a high gain inverting amplifier 96 receiving emitter power from a supply voltage 122 through a resistor 92. In this embodiment, the collector DC current is passed to ground 104 through a resistor 100, and collector AC currents are passed to ground 108 through a capacitor 106. Base bias voltage is supplied by a voltage divider resistor 94 connected to supply voltage 122 and voltage divider resistor 98 connected to ground 102. Output from the emitter is passed through capacitor 116 to the base of a second inverting amplifier 124.

Inverting amplifier 124 receives emitter power from supply voltage 122 through a resistor 120. Base bias voltage is supplied by voltage divider resistor 118 connected to supply voltage 122 and voltage divider resistor 112 connected to ground 110. Collector DC current from inverting amplifier 124 is passed through resistor R8 to ground 134. The collector AC current is passed through capacitor 126 to ground 136. The three state output waveform 88 is taken from the emitter of inverting amplifier 124. The resonant frequency is established by an inductor 128 in series with capacitor 132 attached to ground 133. A feedback signal is taken from the junction of inductor 128 and capacitor 132. This signal is passed through capacitor 91 to the base of amplifier 96.

FIG. 2D is a graphical representation of the output 88 of the simple three state oscillator. This output has the following three levels:

For V positive and DV positive, level 88A;

For V positive and DV negative, level 88B

For V negative and DV positive, level 88B;

For V negative and DV negative, level 88C.

Figure 3:
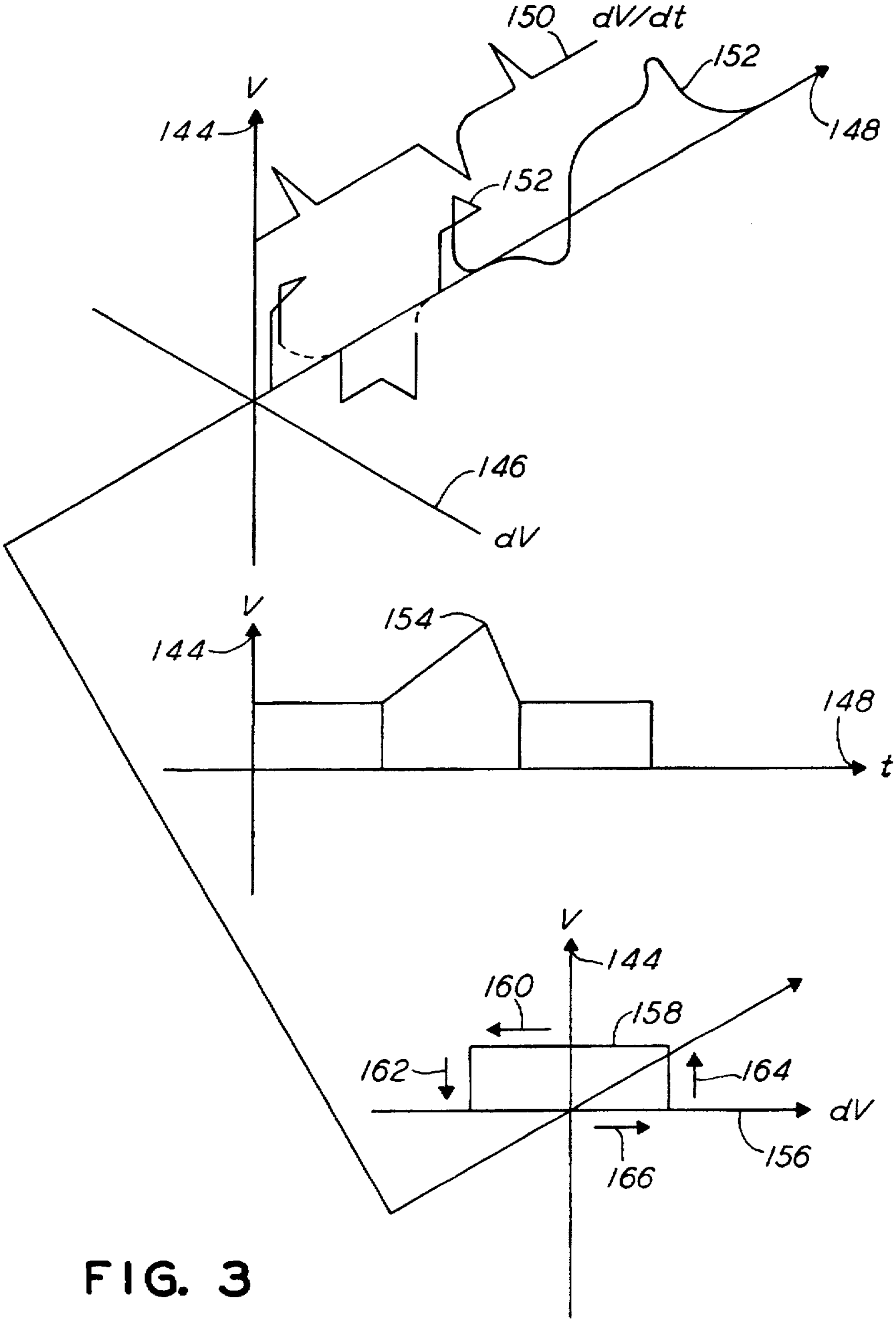
FIG. 3 is a graphical representation of three state and four state logic circuit operation.

Now referring to FIG. 3 which is a graphical representation of three state and four state logic circuits exhibiting the following features: voltage axis 144 dependent on change in voltage axis 146 and time axis 148; first change in voltage axis 146 dependent on voltage axis 144 and time axis 148; time axis 148 dependent on voltage axis 144 and change in voltage axis 146; display of change in voltage as a function of the change in time 150; display of system behavior as a function of time 152; typical oscillographic display of a system alternating between two states as a function of time 154; second change in voltage axis 156 dependent on voltage axis 144; display of constant potential state 158; display of path direction for system 160; first display of path of transition 162 from constant potential state 158 to a second voltage state; second display of path of transition 164 from one voltage state to constant potential 158; display of path of direction for system 166.

Figure 4:
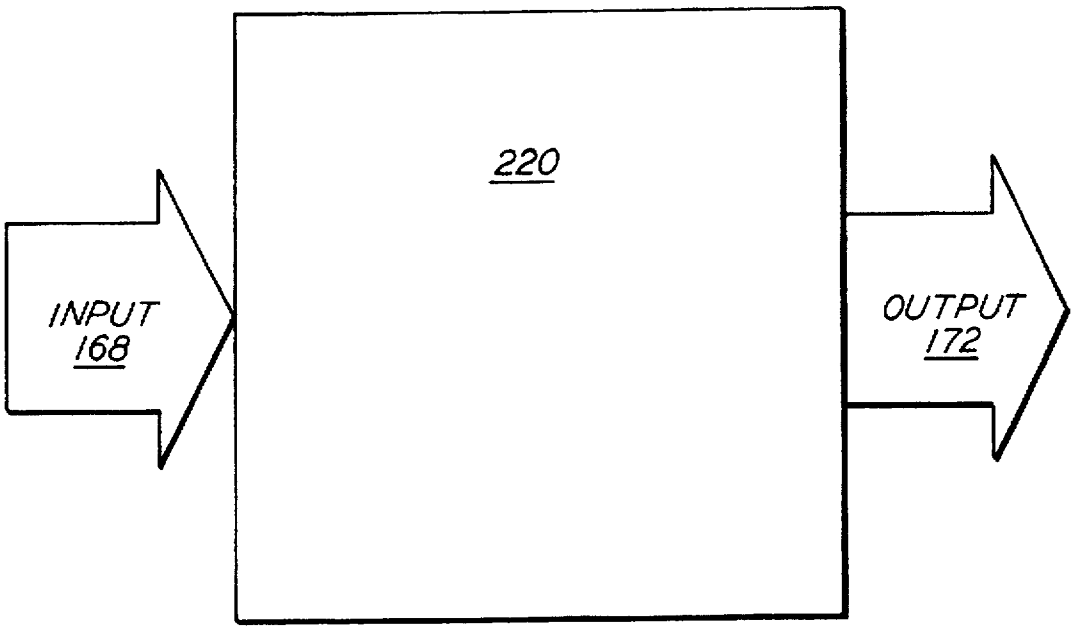
FIG. 4 is a pictorial representation of data entering and exiting the invention.

Now referring to FIG. 4 which is a pictorial representation of data entering and exiting the apparatus of the present invention exhibiting the following features: input data 168 to be evaluated in multi-state logic engine resulting in output data 172; multistate logic engine 10; output data 172 represents the processed input data 168 from multi-state logic engine 10.

Figure 5:
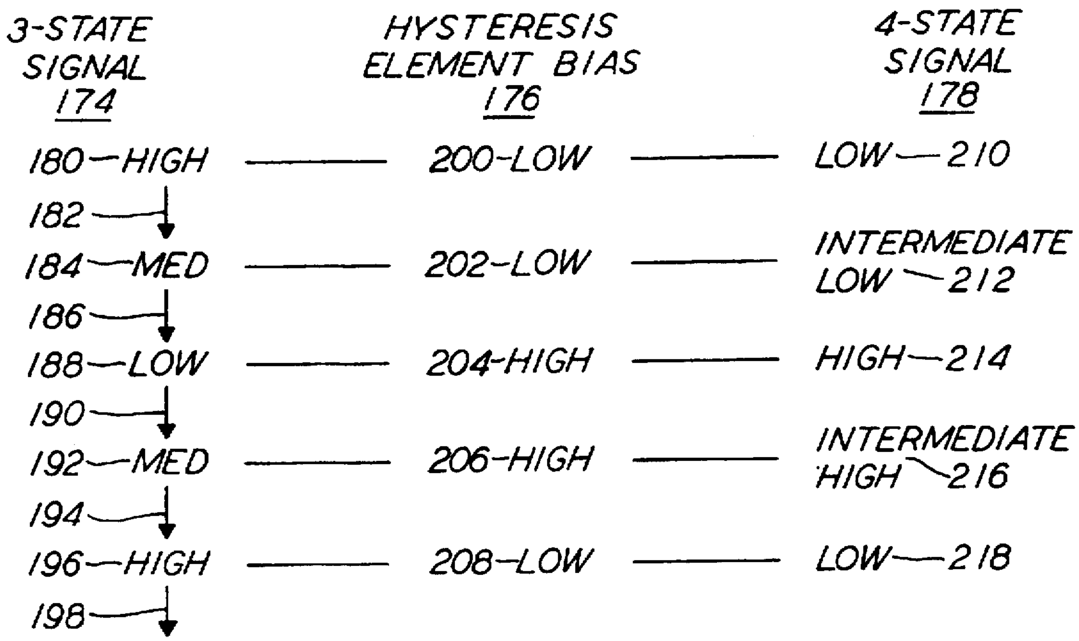
FIG. 5 is a chart of the three state signal, hysteresis element and resulting four state signal.

Now referring to FIG. 5 which is a chart of the three state signal, hysteresis element and four state signal exhibiting the following features: chart of three state signal 174 corresponding to the chart of hysteresis element 176 and the chart of four state signal 178; the chart of hysteresis element 176 corresponding to the chart of three state signal 174 and the chart of four state signal 178; the chart of four state signal 178 corresponding to the chart of hysteresis element 176 and to the chart of three state signal 174; first three state output 180 at initial high condition, and/or "state"; first transition direction 182 from first three state output 180 to second three state output 184; second three state output 184 at intermediate signal level and/or "state"; second transition direction 186 from second three state output 184 to third three state output 188; third three state output 188 at third level and/or "state"; third transition direction 190 from third three state output 188 to fourth three state output 192; fourth three state output 192 at intermediate signal level and/or "state"; fourth transition direction 194 from fourth three state output 192 to fifth three state output 196; fifth three state output 196 at high signal level and/or "state"; fifth transition direction 198 from fifth three state output 196 to next three state output; first output hysteresis element 200 from multi-state logic engine 10; second output hysteresis element 202 from multi-state logic engine 10; third output hysteresis element 204 from multistate logic engine 10; fourth output hysteresis element 206 from multi-state logic engine 10; fifth output hysteresis element 208 from multi-state logic engine 10; first four state signal output 210 from; multi-state logic engine 10; first four state signal output 212 from multi-state logic engine 10; third four state signal output 214 from multi-state logic engine 10; fourth four state signal output 216 from multi-state logic engine 10; fifth four state signal output 218 from multi-state logic engine 10.

Figure 6:
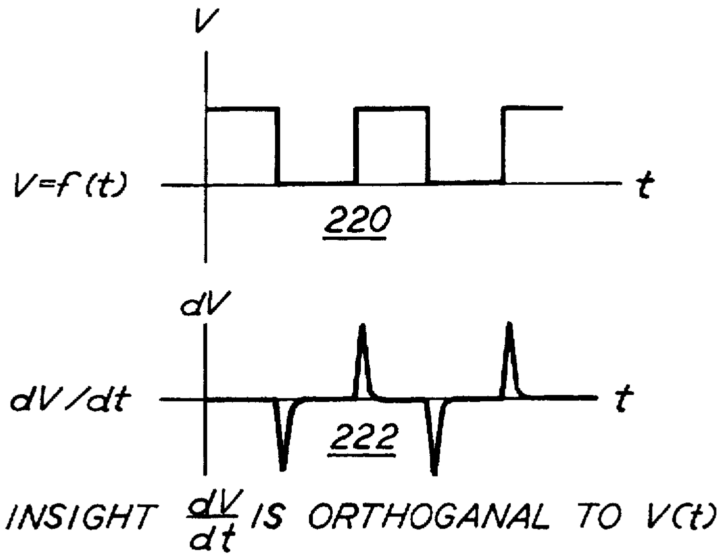
FIG. 6 provides a graphical representation of voltage versus time, and time rate of change of voltage versus time.

FIG. 6 shows a plot of the voltage versus time of a square wave, and the change in voltage with time.

Figure 7:
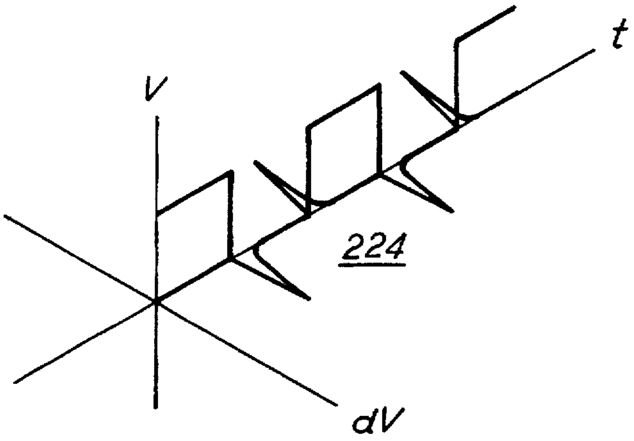
FIG. 7 is a combined graphical representation in three dimensions of the voltage versus time and the time rate of change of voltage versus time.

FIG. 7 shows a combined graphical representation in the form of a perspective view of the voltage versus time and the change in voltage versus time.

Figure 8:
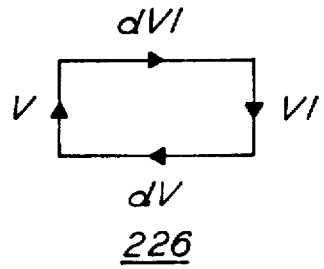
FIG. 8 is a graphical representation of a four state signal, wherein the voltage versus the time rate of change of voltage, as seen in FIG. 7, is shown as if the time axis were coming out of the page.

Now referring to FIG. 8 which is a two dimensional graph of the change in voltage vs. voltage. This diagram is a two dimensional representation of the graphical representation shown in FIG. 7. This shows the output of the four-state logic engine as the four sides of a rectangle.

Figure 9:
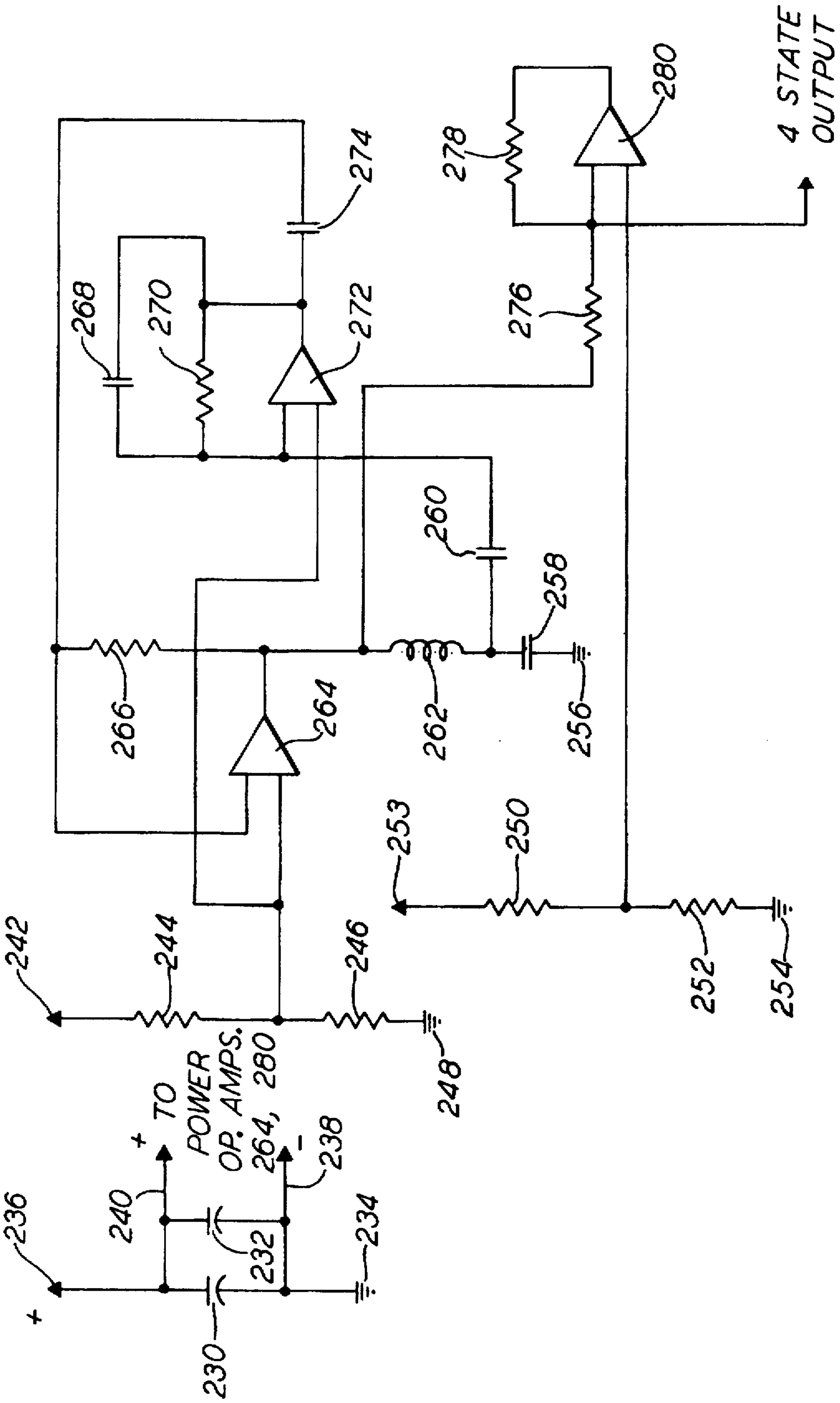
FIG. 9 is a schematic view of an exemplary three state/four state timing/oscillator circuit.

FIG. 9 is a schematic illustration of a logical engine which generates both a three-state output and a four state output. It has operational amplifiers 264, 272 and 280. These receive power through connections (not shown) from voltage 240 which is derived from voltage source 236. AC voltage components are removed by capacitors 230 and 232. Operational amplifiers 264,272, and 280 are grounded through connections (not shown) to ground 238.

The frequency of this circuit is established by a series resonant circuit consisting of inductor 262 and capacitor 258. A sinusoidal signal at the resonant frequency is taken from the junction of inductor 262 and capacitor 258 and applied through capacitor 260 to the negative input terminal of an operational amplifier 272. This operational amplifier 272 has a feedback path from its output through resistor 270 in parallel with capacitor 268 to its negative input terminal. It also supplies feedback through capacitor 274 to the input terminal of operational amplifier 264.

The positive input terminal of operational amplifier 264 has a bias established by voltage supply 242 through the voltage divider network consisting of a resistor 244 in series with another resistor 246, which is connected to ground 248. The feedback signal from the output of operational amplifier 272 also passes through resistor 266 to the output terminal of operational amplifier 264. The output terminal of operational amplifier 264 is also connected to inductor 262, and it is connected to the negative input of operational amplifier 280 through resistor 276.

Operational amplifier 280 has a feedback path from its output to its positive input through resistor 278. The bias voltage for operational amplifier 280 is supplied from voltage source 253 through resistor 250, in cooperation with resistor 252, which is connected to ground 254. Resistor 250 and resistor 252 act as a voltage divider network.

Figure 10:
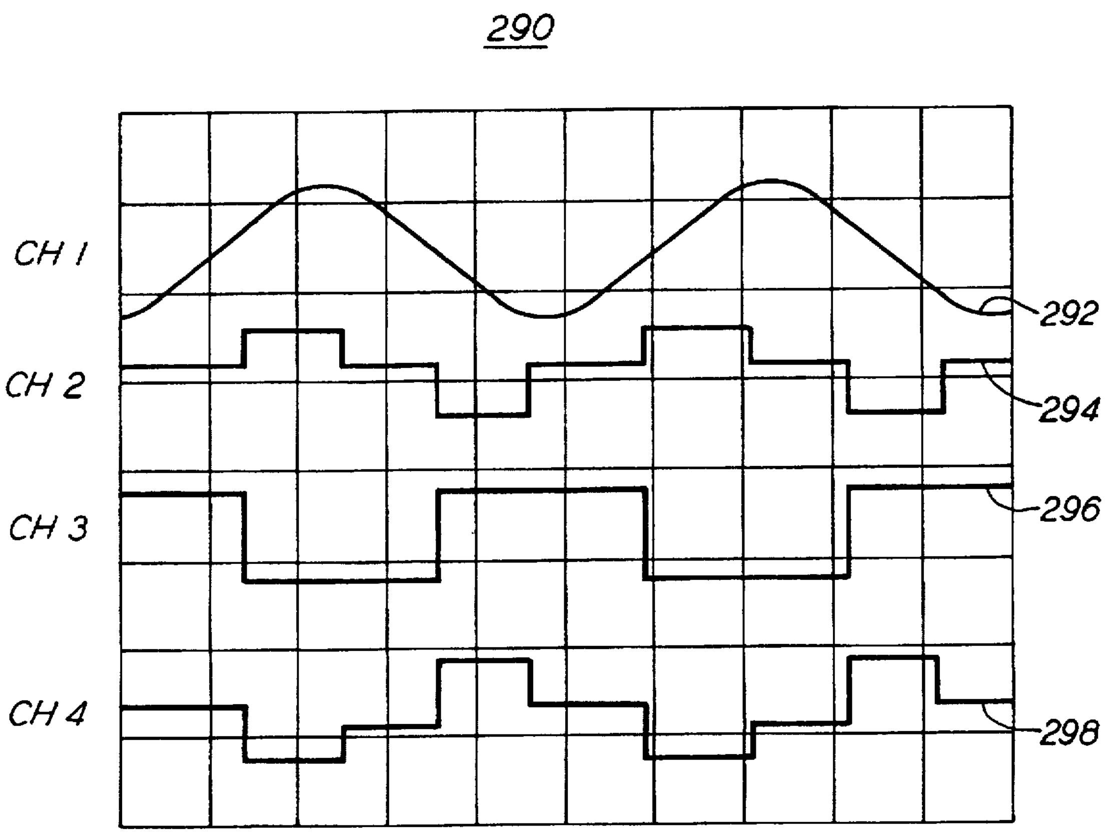
FIG. 10 is an oscilloscope trace of internal voltage waveforms and the outputs of the three state/four state machine.

FIG. 10 shows oscilloscope traces of various signals in the circuit of FIG. 9. A sinusoidal signal 292 is obtained from the junction of inductor 262 and capacitor 258. Signal 296 is a square wave obtained at the output of operational amplifier 272. The signal 294 is a three level signal obtained from the output of operational amplifier 264. Signal 298 is a four level signal which is obtained at the positive input terminal of such operational amplifier 280, which acts as a Schmidt trigger.

Now, discussing the invention more broadly, an analog to digital converter is described for interpreting a first numerical value of a first physical quantity, such as a voltage signal, a current signal, or an optical signal. The first numerical value of the first physical quantity depends upon a second numerical value of a second physical quantity. Time, for example, could be the second physical quantity. The engine produces an output, for each numerical value of the second physical quantity, the output indicating a third physical quantity which indicates the first physical quantity in relation to the second physical quantity. The engine has means for making a first determination as to whether the first numerical value of the first physical quantity is in excess of a predetermined reference value. The engine also has means for making a second determination as to whether the first numerical value of the first physical quantity is increasing or decreasing with the second numerical value of the second physical quantity. The engine has means for generating the output based on the first determination and on the second determination, the output being, for example, a voltage signal, a current signal, or an optical signal. The output has one of at least four alternative values:

(1) a first one of the four alternative values if the first value of the first physical quantity is in excess of the predetermined reference value and the first value of the first physical quantity is increasing with the second numerical value of the second physical quantity;

(2) a second one of the four alternative values if the first value of the first physical quantity is in excess of the predetermined value and the first value of the first physical quantity is decreasing with the second numerical value of the second physical quantity;

(3) a third one of the four alternative values if the first value of the first physical quantity is less than the predetermined value and the first value of the first physical quantity is decreasing with the second numerical value of the second physical quantity; and (4) a fourth one of the four alternative values if the first value of the first physical quantity is less than the predetermined value and the first value of the first physical quantity is increasing with the second numerical value of the second physical quantity.

The engine also has means for communicating the output of the engine as a four level output signal. For example, if the output is a voltage signal, a pair of output terminals may be used.

In a further aspect, the invention provides an analog to digital converter as described above, in which the means for making a first determination as to whether the first numerical value of the first physical quantity is in excess of a predetermined reference value generates a first binary signal having a first binary signal amplitude. Likewise, the means for making the second determination as to whether the first numerical value of the first physical quantity is increasing or decreasing with the second numerical value of the second physical quantity generates a second binary signal having a second binary signal amplitude. The output of the engine may be determined as a linear combination of the first binary signal and the second binary signal. The linear combination may be obtained as either an addition or a subtraction of the two binary signal amplitudes, provided the second binary signal amplitude is not equal to the first binary signal amplitude. For example, the first binary signal amplitude may be greater than the second binary signal amplitude.

The analog to digital converter may produce the four alternative output values, having the following relation to the input signal:

the first alternative value may have the greatest magnitude of the four.;

the second alternative value may have a next to greatest magnitude;

the third alternative value may have a least magnitude; and the fourth alternative value may have a next to least magnitude.

Conversely, the four alternative values may have magnitudes as follows:

the first alternative value may have the least magnitude;

the second alternative value may have the next to least magnitude;

the third alternative value may have a greatest magnitude; and the fourth alternative value may have a next to greatest magnitude.

The analog to digital converter is not restricted to signals in which the second numerical value representing the second physical quantity is continuous. It may be a variable having discrete values. In this case, the first physical quantity has a value for each of the discrete values of the second physical quantity.

For a case in which the second physical quantity is time, the engine may also have an oscillator which generates the first physical quantity.

In a further aspect, the invention provides an analog to digital converter for interpreting a first numerical value of a first physical quantity which depends on a second numerical value of a second physical quantity. For example, the first physical quantity may be a voltage signal, a current signal, or an optical signal, and the second physical quantity may be time. The engine produces a three level output, which has a value for each second numerical value of the second physical quantity. The output is a third physical quantity which indicates the first physical quantity in relation to the second physical quantity. For example, the output may be a voltage signal, a current signal, or an optical signal. The engine has means for making a first determination as to whether the first numerical value of the first physical quantity is in excess of a predetermined reference value. It also has means for making a second determination as to whether the first numerical value of the first physical quantity is increasing or decreasing with the second numerical value of the second physical quantity In addition, the engine has means for generating the output based on the first determination and on the second determination, the output having one of at least three alternative values:

a first one of the three alternative values if the first value of the first physical quantity is in excess of the predetermined reference value and the first value of the first physical quantity is increasing with the second numerical value of the second physical quantity;

a second one of the three alternative values if the first value of the first physical quantity is in excess of the predetermined value and the first value of the first physical quantity is decreasing with the second numerical value of the second physical quantity, or if the first value of the first physical quantity is less than the predetermined value and the first value of the first physical quantity is increasing with the second numerical value of the second physical quantity; or a third one of the three alternative values if the first value of the first physical quantity is less than the predetermined value and the first value of the first physical quantity is decreasing with the second numerical value of the second physical quantity.

The engine also has means such as a pair of output terminals for communicating the output signal as an output from the analog to digital converter.

The means which this engine has for making a first determination as to whether the first numerical value of the first physical quantity is in excess of a predetermined reference value may generate a first binary signal having a first binary signal amplitude, and the means for making a second determination as to whether the first numerical value of the first physical quantity is increasing or decreasing with the second numerical value of the second physical quantity may generate a second binary signal having a second binary signal amplitude; the second binary signal amplitude being about equal to the first binary signal amplitude. The output of this engine may then be determined as either an additive combination or a subtractive combination of the first binary signal and the second binary signal.

This analog to digital converter is not restricted to signals in which the second numerical value representing the second physical quantity is continuous. It may be a variable having discrete values. In this case, the first physical quantity has a value for each of the discrete values of the second physical quantity. This analog to digital converter may also have an oscillator which generates an analog signal, which is processed in the converter to produce a periodic three-valued digital output.

In a further aspect, this invention provides a logical engine which has an oscillator for generating a first signal which is an analog signal varying periodically with time. The engine has means for generating a reference value for the first signal, and means for generating a second signal varying periodically in time, the second signal having one of four alternative values:

a first one of the four alternative values if the magnitude of the first signal is in excess of the reference value and the magnitude of the first signal is increasing with the time;

a second one of the four alternative values if the magnitude of the first signal is in excess of the predetermined value and the magnitude of the first signal is decreasing with the time;

a third one of the four alternative values if the magnitude of the first signal is less than the predetermined value and the magnitude of the first signal is decreasing with the time;

a fourth one of the four alternative values if the magnitude of the first signal is less than the predetermined value and the magnitude of the first signal is increasing with the time;

The logical engine has means such as a pair of output terminals for providing the second signal as an output. It also has means for generating a third signal varying periodically in time, the third signal having one of three alternative values:

a first one of the three alternative values value if the magnitude of the first signal is in excess of the reference value and the magnitude of the first signal is increasing with the time;

a second one of the three alternative values if the magnitude of the first signal is in excess of the predetermined value and the magnitude of the first signal is decreasing with the time, or if the magnitude of the first signal is less than the predetermined value and the magnitude of the first signal is increasing with the time;

a third one of the three alternative values if the magnitude of the first signal is less than the predetermined value and the magnitude of the first signal is decreasing with the time.

The logical engine also has means such as a pair of output terminals for providing the third signal as an output.

In this engine, the means for generating the second signal having one of four alternative values may include a hysteresis element.

It will be understood that each of the elements described above, or two or more together, may also find a useful application in other electronic devices differing from the types described above.

The invention is not intended to be limited to the details shown, since it will be understood that various omissions, modifications, substitutions and changes in the forms and details of the device illustrated and in its operation can be made by those skilled in the art without departing in any way from the spirit of the present invention, as defined by the attached claims.

What is claimed as new and desired to be protected by Letters Patent is set forth in the attached claims:

1. An analog to digital converter for interpreting a first numerical value of a first physical quantity, such first numerical value of such first physical quantity depending upon a second numerical value of a second physical quantity, said analog to digital converter producing an output, for each of such second numerical value of such second physical quantity, said output indicative of a third physical quantity indicative of such first physical quantity in relation to such second physical quantity, said analog to digital converter comprising:

(a) means for making a first determination as to whether such first numerical value of such first physical quantity is in excess of a predetermined reference value;

(b) means for making a second determination as to whether such first numerical value of such first physical quantity is increasing or decreasing with such second numerical value of such second physical quantity;

(c) means for generating said output based on said first determination and on said second determination, said output being a digital output having one of at least four alternative values:

a first one of said alternative values if such first value of such first physical quantity is in excess of such predetermined reference value and such first value of such first physical quantity is increasing with such second numerical value of such second physical quantity;

a second one of said alternative values if such first value of such first physical quantity is in excess of such predetermined value and such first value of such first physical quantity is decreasing with such second numerical value of such second physical quantity;

a third one of said alternative values if such first value of such first physical quantity is less than such predetermined value and such first value of such first physical quantity is decreasing with such second numerical value of such second physical quantity;

a fourth one of said alternative values if such first value of such first physical quantity is less than such predetermined value and such first value of such first physical quantity is increasing with such second numerical value of such second physical quantity; and (d) means for communicating said output as an output from said analog to digital converter.

2. An analog to digital converter, according to claim 1, wherein such second physical quantity is time and such second numerical value is a numerical value representing time.

3. An analog to digital converter, according to claim 1, wherein such first physical quantity is at least one of a voltage signal, a current signal, and an optical signal, and wherein said third physical quantity is at least one of a voltage signal, a current signal, and an optical signal.

4. An analog to digital converter, according to claim 1, wherein said means for making a first determination as to whether such first numerical value of such first physical quantity is in excess of a predetermined reference value generates a first binary signal having a first binary signal amplitude.

5. An analog to digital converter, according to claim 1, wherein said means for making a second determination as to whether such first numerical value of such first physical quantity is increasing or decreasing with such second numerical value of such second physical quantity generates a second binary signal having a second binary signal amplitude.

6. An analog to digital converter, according to claim 1, wherein:

said means for making a first determination as to whether such first numerical value of such first physical quantity is in excess of a predetermined reference value generates a first binary signal having a first binary signal amplitude;

said means for making a second determination as to whether such first numerical value of such first physical quantity is increasing or decreasing with such second numerical value of such second physical quantity generates a second binary signal having a second binary signal amplitude;

said output determined as a linear combination of said first binary signal and said second binary signal.

7. An analog to digital converter, according to claim 6, wherein said second binary signal amplitude is not equal to said first binary signal amplitude; and said linear combination of said first binary signal and said second binary signal is one of an additive combination and a subtractive combination of said first binary signal and said second binary signal.

8. An analog to digital converter, according to claim 7, wherein said first binary signal amplitude is greater than said second binary signal amplitude.

9. An analog to digital converter according to claim 1 wherein said first alternative value, said second alternative value, said third alternative value and said fourth alternative value have relative magnitudes as follows:

said first alternative value has a greatest magnitude;

said second alternative value has a next to greatest magnitude;

said third alternative value has a least magnitude; and said fourth alternative value has a next to least magnitude.

10. An analog to digital converter, according to claim 1, wherein said first alternative value, said second alternative value, said third alternative value and said fourth alternative value have relative magnitudes as follows:

said first alternative value has a least magnitude;

said second alternative value has a next to least magnitude;

said third alternative value has a greatest magnitude; and said fourth alternative value has a next to greatest magnitude.

11. An analog to digital converter, according to claim 1, wherein such second numerical value is a numerical value of a discrete variable representing such second physical quantity.

12. An analog to digital converter, according to claim 1, further comprising an oscillator means for generating said first physical quantity, said first physical quantity varying periodically with such second physical quantity, such second physical quantity being time.

13. An analog to digital converter for interpreting a first numerical value of a first physical quantity, such first numerical value of such first physical quantity depending upon a second numerical value of a second physical quantity, said analog to digital converter producing an output, for each of such second numerical value of such second physical quantity, said output indicative of a third physical quantity indicative of such first physical quantity in relation to such second physical quantity, said analog to digital converter comprising:

(a) means for making a first determination as to whether such first numerical value of such first physical quantity is in excess of a predetermined reference value;

(b) means for making a second determination as to whether such first numerical value of such first physical quantity is increasing or decreasing with such second numerical value of such second physical quantity;

(c) means for generating said output based on said first determination and on said second determination, said output being a digital output having one of at least three alternative values:

a first one of said alternative values if such first value of such first physical quantity is in excess of such predetermined reference value and such first value of such first physical quantity is increasing with such second numerical value of such second physical quantity;

a second one of said alternative values if such first value of such first physical quantity is in excess of such predetermined value and such first value of such first physical quantity is decreasing with such second numerical value of such second physical quantity;

said second one of said alternative values if such first value of such first physical quantity is less than such predetermined value and such first value of such first physical quantity is increasing with such second numerical value of such second physical quantity;

a third one of said alternative values if such first value of such first physical quantity is less than such predetermined value and such first value of such first physical quantity is decreasing with such second numerical value of such second physical quantity; and (d) means for communicating said output as an output from said analog to digital converter.

14. An analog to digital converter, according to claim 13, wherein such second physical quantity is time, and such second numerical value is a numerical value representing time.

15. An analog to digital converter, according to claim 13, wherein such first physical quantity is at least one of a voltage signal, a current signal, and an optical signal, and wherein said third physical quantity is at least one of a voltage signal, a current signal, and an optical signal.

16. An analog to digital converter, according to claim 13, wherein:

said means for making a first determination as to whether such first numerical value of such first physical quantity is in excess of a predetermined reference value generates a first binary signal having a first binary signal amplitude;

said means for making a second determination as to whether such first numerical value of such first physical quantity is increasing or decreasing with such second numerical value of such second physical quantity generates a second binary signal having a second binary signal amplitude;

said second binary signal amplitude being about equal to said first binary signal amplitude; and said output determined as one of an additive combination and a subtractive combination of said first binary signal and said second binary signal.

17. An analog to digital converter, according to claim 13, wherein such second numerical value is a numerical value of a discrete variable representing such second physical quantity.

18. An analog to digital converter, according to claim 13, further comprising an oscillator means for generating said first physical quantity, said first physical quantity varying periodically with such second physical quantity, such second physical quantity being time.

19. A logical engine comprising:

(a) an oscillator for generating a first signal varying periodically in time;

(b) means for generating a reference value for said first signal;

(c) means for generating a second signal varying periodically in time, said second signal having one of four alternative values:

a first one of said four alternative values if a magnitude of said first signal is in excess of said reference value and said magnitude of said first signal is increasing with such time; a second one of said four alternative values if said magnitude of said first signal is in excess of said predetermined value and said magnitude of said first signal is decreasing with such time;

a third one of said four alternative values if said magnitude of said first signal is less than said predetermined value and said magnitude of said first signal is decreasing with such time;

a fourth one of said four alternative values if said magnitude of said first signal is less than said predetermined value and said magnitude of said first signal is increasing with such time;

(d) means for providing said second signal as an output;

(e) means for generating a third signal varying periodically in time, said third signal having one of three alternative values:

a first one of said three alternative values value if a magnitude of said first signal is in excess of said reference value and said magnitude of said first signal is increasing with such time;

a second one of said three alternative values if said magnitude of said first signal is in excess of said predetermined value and said magnitude of said first signal is decreasing with such time;

said second one of said three alternative values if said magnitude of said first signal is less than said predetermined value and said magnitude of said first signal is increasing with such time;

a third one of said three alternative values if said magnitude of said first signal is less than said predetermined value and said magnitude of said first signal is decreasing with such time;

(f) means for providing said third signal as an output.

20. A logical engine, according to claim 19, wherein said means for generating said second signal having one of four alternative values includes a hysteresis element.

* * * * *